United States Patent
Yang et al.

(10) Patent No.: US 12,027,407 B2
(45) Date of Patent: Jul. 2, 2024

(54) SUBSTRATE SUPPORT APPARATUS AND METHOD

(71) Applicant: TAIWAN SEMICONDUCTOR MANUFACTURING COMPANY, LTD., Hsinchu (TW)

(72) Inventors: Yueh Lin Yang, Hsinchu (TW); Chi-Hung Liao, Sanchong (TW); Fei-Gwo Tsai, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 263 days.

(21) Appl. No.: 15/723,505

(22) Filed: Oct. 3, 2017

(65) Prior Publication Data

US 2019/0027392 A1    Jan. 24, 2019

Related U.S. Application Data

(60) Provisional application No. 62/534,290, filed on Jul. 19, 2017.

(51) Int. Cl.
| | |
|---|---|
| *H01J 37/32* | (2006.01) |
| *C23C 14/50* | (2006.01) |
| *C23C 16/458* | (2006.01) |
| *H01L 21/673* | (2006.01) |
| *H01L 21/683* | (2006.01) |
| *H01L 21/687* | (2006.01) |
| *H05K 7/14* | (2006.01) |

(52) U.S. Cl.
CPC ........ *H01L 21/6838* (2013.01); *C23C 14/505* (2013.01); *C23C 16/4586* (2013.01); *H01L 21/673* (2013.01); *H01L 21/6734* (2013.01); *H01L 21/6835* (2013.01); *H01L 21/687* (2013.01); *H01L 21/6875* (2013.01); *H05K 7/14* (2013.01)

(58) Field of Classification Search
None
See application file for complete search history.

(56) References Cited

U.S. PATENT DOCUMENTS

| | | | | |
|---|---|---|---|---|
| 6,196,532 B1 * | 3/2001 | Otwell | ................ | H01L 21/6838 269/21 |
| 6,257,564 B1 * | 7/2001 | Avneri | .................. | B25B 11/005 269/21 |
| 7,432,476 B2 * | 10/2008 | Morita | ...................... | F27B 5/04 118/725 |
| 2003/0072639 A1 * | 4/2003 | White | ............... | H01L 21/67309 414/217 |
| 2004/0020788 A1 * | 2/2004 | Mavliev | ............ | H01L 21/32125 205/640 |

(Continued)

*Primary Examiner* — Jeffrie R Lund
*Assistant Examiner* — Tiffany Z Nuckols
(74) *Attorney, Agent, or Firm* — Hauptman Ham, LLP

(57) ABSTRACT

A substrate support apparatus includes a housing and a plurality of spherical supports. The housing has a top surface, the top surface including a plurality of openings. The housing is configured to position the plurality of spherical supports within the plurality of openings so that topmost surfaces of the plurality of spherical supports are arranged in a plane above the top surface. A spherical support of the plurality of spherical supports is rotatable within the housing.

20 Claims, 6 Drawing Sheets

(56) References Cited

U.S. PATENT DOCUMENTS

| | | | | |
|---|---|---|---|---|
| 2004/0170407 A1* | 9/2004 | Nguyen | ............ | H01L 21/6734 |
| | | | | 392/416 |
| 2006/0130767 A1* | 6/2006 | Herchen | ............ | H01L 21/6715 |
| | | | | 118/728 |
| 2007/0006806 A1* | 1/2007 | Imai | ............ | H01L 21/324 |
| | | | | 118/620 |
| 2007/0246839 A1* | 10/2007 | Herchen | ............ | H01L 21/6875 |
| | | | | 257/784 |
| 2011/0168330 A1* | 7/2011 | Sakaue | ............ | H01L 21/6875 |
| | | | | 156/345.31 |
| 2013/0014896 A1* | 1/2013 | Shoji | ............ | C23C 16/5096 |
| | | | | 156/345.34 |
| 2014/0217665 A1* | 8/2014 | Cuvalci | ............ | H01L 21/67126 |
| | | | | 269/21 |

* cited by examiner

SUBSTRATE SUPPORT APPARATUS AND METHOD

BACKGROUND

In integrated circuit (IC) manufacturing, individual IC elements are formed and tested using various pieces of manufacturing equipment to perform multiple operations. Manufacturing operations often include forming new features by aligning to features formed in previous manufacturing operations. For some manufacturing operations, a substrate, or wafer, on which ICs are built is loaded onto a wafer table and held in position by a vacuum applied to a bottom surface of the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
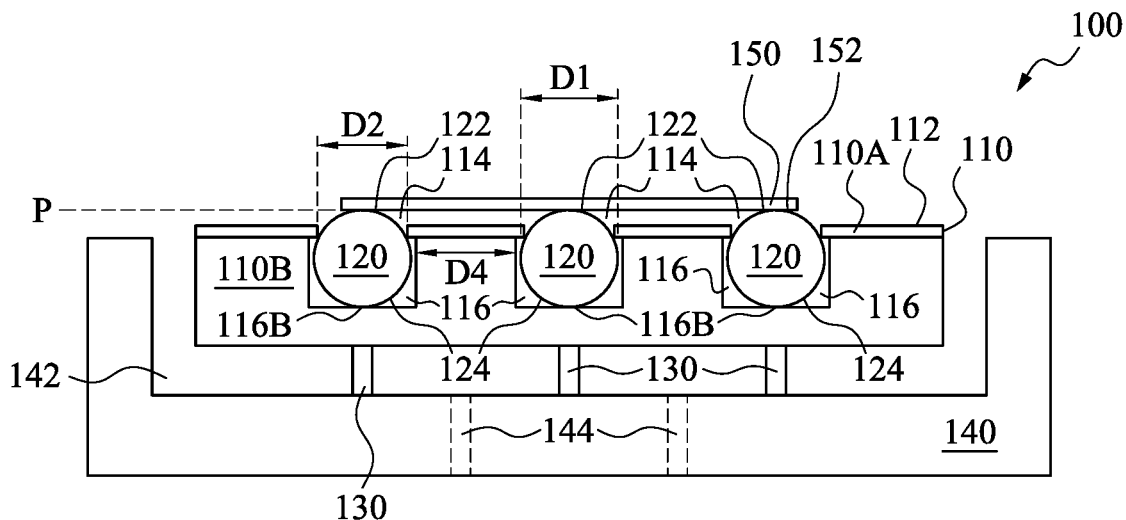
FIGS. 1A-1B are diagrams of a substrate support apparatus, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a substrate support apparatus includes a housing and a plurality of spherical supports. The housing is configured to position the spherical supports so that top surfaces of the spherical supports are arranged in a plane above the housing, and so that at least one spherical support is rotatable within the housing. A rotatable spherical support allows a substrate loaded onto the substrate support apparatus to respond to an applied vacuum by flattening with little resistance from the rotatable spherical support. Compared to approaches that do not include least one rotatable spherical support, the substrate support apparatus enables improved substrate planarity and therefore improved alignment for manufacturing operations.

Figure 1B:
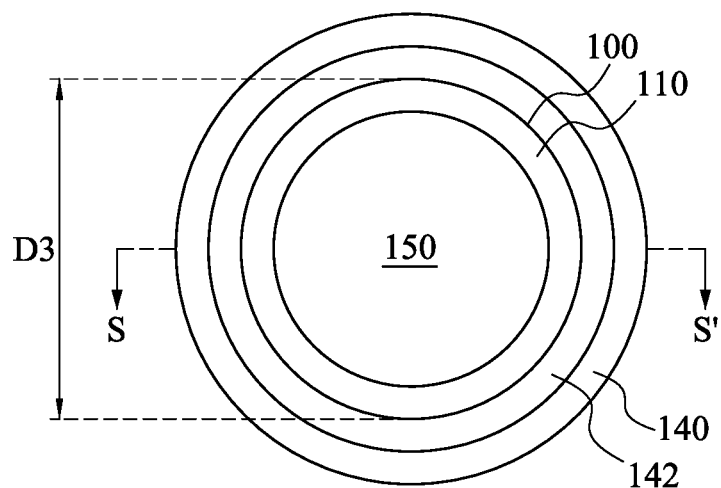

FIGS. 1A and 1B are diagrams of a substrate support apparatus 100, in accordance with some embodiments. FIG. 1A depicts a cross-sectional view of substrate support apparatus 100 positioned on a chuck 140, and a substrate 150 positioned on substrate support apparatus 100. FIG. 1B depicts a plan view of substrate 150, substrate support apparatus 100, and chuck 140. The cross-sectional plane depicted in FIG. 1A is indicated by line S-S' in FIG. 1B.

Substrate support apparatus 100, also referred to as a wafer table, includes a housing 110, spherical supports 120 positioned within housing 110, and lower supports 130, positioned below housing 110.

Housing 110 includes a top surface 112, openings 114 in top surface 112, and chambers 116 in which spherical supports 120 are positioned.

Each spherical support 120 has a diameter D1. Each opening 114 has a width D2 that is smaller than diameter D1 such that each spherical support 120 partially protrudes through each opening 114 and extends above top surface 112. Each spherical support 120 thereby has a topmost surface 122 positioned above top surface 112.

In some embodiments, each opening 114 has a circular perimeter, and width D2 is a diameter of the circular perimeter. In some embodiments, each opening 114 has a perimeter with a shape of a square, rectangle, other polygon, ellipse, or other closed loop, and width D2 is a width of the square, rectangle, polygon, ellipse, or other closed loop.

Openings 114 and chambers 116 are configured so that spherical supports 120 have topmost surfaces 122 aligned in a plane P, perpendicular to a plane of the cross-section depicted in FIG. 1. Plane P is depicted in FIG. 1A as a dashed line representing an intersection of plane P with the plane of the depicted cross-section.

Housing 110 includes a top section 110A that includes top surface 112 and openings 114, and a bottom section 110B. Top section 110A and bottom section 110B together define chambers 116.

Top section 110A, by including openings 114 having widths D2 smaller than diameter D1, is configured to, in operation, restrict upward movement of spherical supports 120, thereby retaining spherical supports 120 within housing 110.

In the embodiment depicted in FIG. 1A, top section 110A is a single, continuous component of housing 110 that includes top surface 112 and openings 114. In some embodiments, top section 110A includes multiple, non-continuous elements that collectively include top surface 112 and openings 114. In some embodiments, top section 110A includes restrictive elements (not labeled), e.g., rings, each of which corresponds to an opening 114, and that collectively constitute top surface 112.

Bottom section 110B is configured to contact bottom surfaces 124 of spherical supports 120 so as to, in operation, restrict downward movement of spherical supports 120, thereby supporting spherical supports 120 within housing 110. Bottom section 110B is configured to support spherical supports 120 so that topmost surfaces 122 are aligned in plane P.

In the embodiment depicted in FIG. 1A, bottom section 110B includes flat bottom surfaces 116B, and is thereby configured to, in operation, restrict downward movement of spherical supports 120 by contacting bottom surfaces 124 with flat bottom surfaces 116B. In the embodiment depicted in FIG. 1A, bottom surfaces 124 are bottommost surfaces of spherical supports 120.

In some embodiments, bottom section 110B includes bottom surfaces other than flat bottom surfaces 116B, and bottom section 110B is configured to otherwise contact bottom surfaces 124 so as to support spherical supports 120 so that topmost surfaces 122 are aligned in plane P. In some embodiments in which bottom section 110B does not include flat bottom surfaces 116B, bottom section 110B includes bottom surfaces that contact bottom surfaces 124 above bottommost surfaces of spherical supports 120.

In some embodiments, bottom section 110B includes bottom surfaces having a three-dimensional contour of a hemisphere or other concave shape. In some embodiments, bottom section 110B includes bottom surfaces 116B having a vertical cross-sectional contour of a portion of a hexagon or other polygon. In some embodiments, bottom section 110B includes bottom surfaces 116B having a horizontal cross-sectional contour of a circle or polygon configured to contact bottom surfaces 124.

In some embodiments, substrate support apparatus 100 includes springs or other flexible structures (not shown) capable of restricting downward motion of spherical supports 120, and bottom surfaces 116B are configured to support the springs or other structures.

Top section 110A and bottom section 110B define chambers 116 by having configurations that, in operation, restrict upward and downward movement of spherical supports 120, as discussed above, and by including sidewalls 116S that, in operation, restrict lateral movement of spherical supports 120.

Top section 110A and bottom section 110B thereby further define chambers 116 so that at least one spherical support 120 is rotatable within at least one chamber 116. Spherical support 120 enclosed by chamber 116 is rotatable within chamber 116 based on an enclosed portion or entirety of every diameter D1 of spherical support 120 being smaller than inner dimensions of chamber 116.

In some embodiments, chamber 116 is configured so that a single spherical support 120 is rotatable within a single chamber 116. In some embodiments, chamber 116 is configured so that two or more spherical supports 120 are rotatable within a single chamber 116.

In some embodiments, top section 110A and bottom section 110B are configured so that each spherical support 120 of a plurality of spherical supports 120 is rotatable within a corresponding chamber 116. In some embodiments, top section 110A and bottom section 110B are configured so that not every spherical support of a plurality of spherical supports 120 is rotatable within a corresponding chamber 116.

In the embodiment depicted in FIG. 1A, sidewalls 116S are vertical elements of bottom section 110B that extend upwardly from bottom surfaces 116B to openings 114 of top section 110A. In some embodiments, housing 110 does not include sidewalls 116S, and bottom surfaces 116B extend upwardly to openings 114 of top section 110A. In some embodiments, sidewalls 116S are components of top section 110A that extend downwardly to bottom surfaces 116B of bottom section 110B.

In some embodiments, openings 114 of top section 110A and bottom surfaces 116B of bottom section 110B are separated by gaps. In some embodiments, some or all of bottom surfaces 116B are a single, continuous, flat surface of bottom section 110B.

Housing 110 includes a metal, e.g., steel, or other material having sufficient strength and rigidity to be capable of supporting spherical supports 120 as discussed above. In some embodiments, top section 110A and bottom section 110B include a same material. In some embodiments, top section 110A and bottom section 110B include different materials.

In some embodiments, top section 110A and bottom section 110B are separate components mechanically coupled with each other or affixed to each other by an adhesive, weld, or other suitable material. In some embodiments, housing 110 has a monolithic structure, and top section 110A and bottom section 110B refer to separate regions of housing 110.

Housing 110 has an overall shape of a disk with a diameter D3 based on a diameter of a substrate, e.g., substrate 150, which substrate support apparatus 100 is configured to support. In some embodiments, housing 110 has diameter D3 based on a recess in a chuck, e.g., a recess 142 of chuck 140 discussed below. Openings 114, chambers 116, and spherical supports 120 are distributed throughout housing 110 so that substrate support apparatus 100 is thereby configured to, in operation, provide support distributed throughout an area occupied by a given substrate.

In some embodiments, substrate support apparatus 100 is configured to provide support for a substrate having a diameter of 200 centimeters (cm). In some embodiments, substrate support apparatus 100 is configured to provide support for a substrate having a diameter of 300 cm. In some embodiments, substrate support apparatus 100 is configured to provide support for a substrate having a diameter of 450 cm.

In various embodiments, substrate support apparatus 100 is configured to provide support by including one or more of openings 114, chambers 116, or spherical supports 120 distributed in one or more patterns. In some embodiments, substrate support apparatus 100 includes openings 114 and spherical supports 120 distributed in a pattern including one or both of spherical support patterns 300A, 300B, or 300C depicted in FIGS. 3A-3C and discussed below. In some embodiments, substrate support apparatus 100 includes chambers 116 distributed in a pattern including one or more of chamber patterns 400A, 400B, or 400C, depicted in FIGS. 4A-4C and discussed below.

In the embodiment depicted in FIG. 1A, a single spherical support 120 corresponds to a single chamber 116 in the cross-sectional plane depicted in FIG. 1A. In some embodiments, e.g., the embodiment depicted in FIG. 2A discussed below, in a cross-sectional plane perpendicular to the cross-sectional plane depicted in FIG. 1A, a single spherical support 120 corresponds to a single chamber 116. In some embodiments, e.g., the embodiments depicted in FIGS. 2B and 2C discussed below, in a cross-sectional plane perpendicular to the cross-sectional plane depicted in FIG. 1A, more than one spherical support 120 corresponds to a single chamber 116.

In some embodiments, a single chamber 116 corresponds to multiple spherical supports 120 in a first direction in a first cross-sectional plane, and multiple spherical supports 120 in a second direction in a second cross-sectional plane perpendicular to the first cross-sectional plane. In some embodiments, a single chamber 116 corresponds to multiple spherical supports 120 in a first direction in a first cross-sectional plane, and multiple spherical supports 120 in a second direction in a second cross-sectional plane non-perpendicular to the first cross-sectional plane.

Adjacent chambers 116 are separated in the cross-section of the FIG. 1A depiction by a distance D4. In some embodiments, pairs of adjacent chambers 116 are separated by distance D4 having a same value for each pair. In some embodiments, pairs of adjacent chambers 116 are separated by distance D4 having different values for different pairs.

In some embodiments, pairs of adjacent chambers 116 are separated by distance D4 having one or more values ranging from 1 millimeter (mm) to 5 mm. In some embodiments, pairs of adjacent chambers 116 are separated by distance D4 having one or more values ranging from 2 mm to 3 mm. In some embodiments, pairs of adjacent chambers 116 are separated by distance D4 having one or more values less than 1 mm. In some embodiments, pairs of adjacent chambers 116 are separated by distance D4 having one or more values greater than 5 mm.

Adjacent chambers 116 are separated by other distances (not shown) in one or more directions other than that of the cross-section of the FIG. 1A depiction. In some embodiments, pairs of adjacent chambers 116 are separated by a distance in another direction having one or more values ranging from 1 millimeter (mm) to 5 mm. In some embodiments, pairs of adjacent chambers 116 are separated by a distance in another direction having one or more values ranging from 2 mm to 3 mm. In some embodiments, pairs of adjacent chambers 116 are separated by a distance in another direction having one or more values less than 1 mm. In some embodiments, pairs of adjacent chambers 116 are separated by a distance in another direction having one or more values greater than 5 mm.

Spherical supports 120 include a material having sufficient strength, hardness, and low coefficients of static and dynamic friction to be capable of being rotatable while supported in chambers 116 so as to have upper surfaces 122 aligned in plane P. In some embodiments, spherical supports 120 include one or more of a semiconductor, a metal, or other suitable material. In some embodiments, spherical supports 120 include SiC.

In some embodiments, diameter D1 of spherical support 120 has a value ranging from 0.10 mm to 0.75 mm. In some embodiments, diameter D1 of spherical support 120 has a value ranging from 0.25 mm to 0.50 mm. In some embodiments, diameter D1 of spherical support 120 has a value less than 0.10 mm. In some embodiments, diameter D1 of spherical support 120 has a value greater than 0.75 mm.

In the embodiment depicted in FIG. 1A, substrate support apparatus 100 includes three each of openings 114, chambers 116, and spherical supports 120. In various embodiments, substrate support apparatus 100 includes fewer than three of one or more of openings 114, chambers 116, or spherical supports. In various embodiments, substrate support apparatus 100 includes greater than three of one or more of openings 114, chambers 116, or spherical supports 120.

In some embodiments, substrate support apparatus 100 includes one or more of openings 114, chambers 116, or spherical supports 120 having a number ranging from 1,000 to 30,000. In some embodiments, substrate support apparatus 100 includes one or more of openings 114, chambers 116, or spherical supports 120 having a number ranging from 4,000 to 12,000.

In the embodiment depicted in FIG. 1A, substrate support apparatus 100 includes a same number of each of openings 114, chambers 116, and spherical supports 120. In some embodiments, substrate support apparatus 100 includes a number of spherical supports 120 less than a number of one or both of openings 114 or chambers 116. In some embodiments, substrate support apparatus 100 includes a number of spherical supports 120 greater than a number of one or both of openings 114 or chambers 116.

In some embodiments, substrate support apparatus 100 includes a number of openings 114 less than a number of chambers 116. In some embodiments, substrate support apparatus 100 includes a number of openings 114 greater than a number of chambers 116.

Lower supports 130 are configured to position housing 110 above chuck 140 or other structure (not shown). In some embodiments, lower supports 130 and housing 110 are separate components mechanically coupled with each other. In some embodiments, lower supports 130 are one or more components of housing 110. In some embodiments, substrate support apparatus 100 does not include lower supports 130, and housing 110 is positioned directly on chuck 140 or another structure (not shown).

In some embodiments, lower supports 130 include one or more closed structures, thereby defining one or more volumes between housing 110 and chuck 140 whereby, in operation, a vacuum is communicated from chuck 140 to substrate support apparatus 100. In some embodiments, lower supports 130 include two or more structures configured as a plurality of concentric rings, thereby defining two or more volumes between housing 110 and chuck 140 whereby, in operation, a vacuum is communicated from chuck 140 to substrate support apparatus 100. In some embodiments, lower supports 130 include a plurality of structures that intersect or otherwise define one or more volumes between housing 110 and chuck 140 whereby, in operation, a vacuum is communicated from chuck 140 to substrate support apparatus 100.

Chuck 140 is a mechanical or electromechanical assembly capable of supporting and applying a vacuum to a substrate support apparatus, e.g., substrate support apparatus 100. Chuck 140 includes recess 142 and apertures 144. Recess 142 is configured to contain the substrate support apparatus, and apertures 144 are configured to apply the vacuum to the substrate support apparatus.

In some embodiments, recess 142 includes one or more closed structures (not shown), thereby defining one or more volumes between housing 110 and chuck 140 whereby, in operation, a vacuum is communicated from chuck 140 to substrate support apparatus 100. In some embodiments, recess 142 includes two or more structures configured as a plurality of concentric rings (not shown), thereby defining two or more volumes between housing 110 and chuck 140 whereby, in operation, a vacuum is communicated from chuck 140 to substrate support apparatus 100. In some embodiments, recess 142 includes a plurality of structures (not shown) that intersect or otherwise define one or more volumes between housing 110 and chuck 140 whereby, in operation, a vacuum is communicated from chuck 140 to substrate support apparatus 100.

In the embodiment depicted in FIG. 1A, apertures 144 extend completely through chuck 140. In some embodiments, a separate assembly (not shown) below chuck 140 is configured to apply a vacuum through apertures 144.

In some embodiments, apertures 144 do not extend completely through chuck 140 and do not reach the bottom of chuck 140. In some embodiments, chuck 140 includes one or more assemblies (not shown) configured to apply a vacuum through apertures 144. In some embodiments, chuck 140 is a component of an IC manufacturing system configured to perform one or more IC manufacturing operations on one or more substrates, e.g., substrate 150. In some embodiments, chuck 140 is configured to control a position of the one or more substrates while the one or more IC manufacturing operations are performed. In some embodiments, chuck 140 is a component of an IC manufacturing system configured to perform one or more photolithography operations. In some embodiments, chuck 140 is a component of an IC manufacturing system configured to perform one or more overlay operations. In some embodiments, chuck 140 is a component of an IC manufacturing system configured to perform one or more optical inspection operations.

Substrate 150, also referred to as a wafer, includes one or more of silicon, gallium arsenide, silicon germanium, SiC, or another semiconductor material or compound semiconductor material suitable as a basis for forming ICs. In various embodiments, substrate 150 includes one or more ICs, non-limiting examples of which include memory, logic, processor, and/or communication circuits.

Substrate support apparatus 100 is configured to communicate an applied vacuum from a chuck, e.g., chuck 140, to a bottom surface of a substrate, e.g., a bottom surface 152 of substrate 150. In some embodiments, substrate support apparatus 100 includes a plurality of apertures (not shown) extending through housing 110, through which, in operation, the applied vacuum is communicated to the substrate.

In some embodiments, apertures are distributed throughout substrate support apparatus 100 so as to, in operation, evenly distribute a communicated vacuum throughout a bottom surface of a substrate, e.g., a bottom surface 152 of substrate 150. In some embodiments, apertures are distributed throughout substrate support apparatus 100 between chambers 116 and separate from chambers 116. In some embodiments, one or more apertures are communicatively coupled with one or more chambers 116 so that, in operation, a vacuum is communicated to the substrate via the one or more chambers 116.

In some operations, apertures extend to top surface 112. In some embodiments, apertures extend to a portion of housing 110 other than top surface 112.

In some embodiments, top surface 112 includes one or more closed structures (not shown), thereby defining one or more volumes between top surface 112 and a bottom surface of a substrate, e.g., bottom surface 152 of substrate 150, whereby, in operation, a vacuum is communicated from substrate support apparatus 100 to the substrate. In some embodiments, top surface 112 includes two or more structures configured as a plurality of concentric rings (not shown), thereby defining two or more volumes between top surface 112 and a bottom surface of a substrate, e.g., bottom surface 152 of substrate 150 whereby, in operation, a vacuum is communicated from substrate support apparatus 100 to the substrate. In some embodiments, top surface 112 includes a plurality of structures (not shown) that intersect or otherwise define one or more volumes between top surface 112 and a bottom surface of a substrate, e.g., bottom surface 152 of substrate 150 whereby, in operation, a vacuum is communicated from substrate support apparatus 100 to the substrate. In some embodiments, one or more defined volumes include one or more openings 114. In some embodiments, on or more defined volumes are free of an opening 114.

By including the elements discussed above, substrate support apparatus 100 is configured to, in operation, support the bottom surface of the substrate against the applied vacuum with spherical supports 120 positioned so that top surfaces 122 arranged in plane P support the bottom surface of the substrate along plane P.

Because at least one spherical support 120 is rotatable within at least one chamber 116, a substrate loaded onto substrate support apparatus 100, in operation, responds to an applied vacuum by flattening with little resistance from the at least one rotatable spherical support 120. Compared to approaches that do not include at least one rotatable spherical support 120, the lowered resistance to substrate flattening provided by substrate support apparatus 100 allows substrates to have improved planarity during IC manufacturing operations. This improved planarity translates to reduced height variations throughout a substrate such that height-sensitive operations, including feature overlays, are improved compared to approaches that do not include at least one rotatable spherical support 120 in a substrate support apparatus.

Figure 2A:
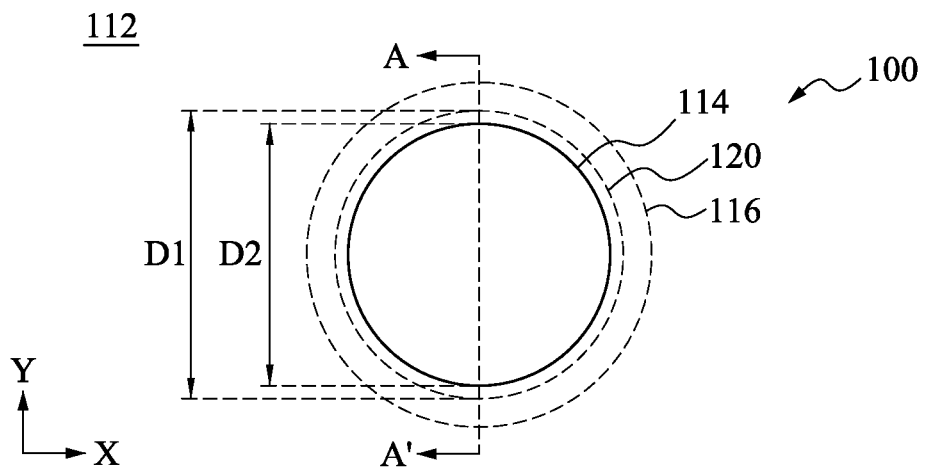
FIGS. 2A-2C are diagrams of a substrate support apparatus, in accordance with some embodiments.
Figure 2B:
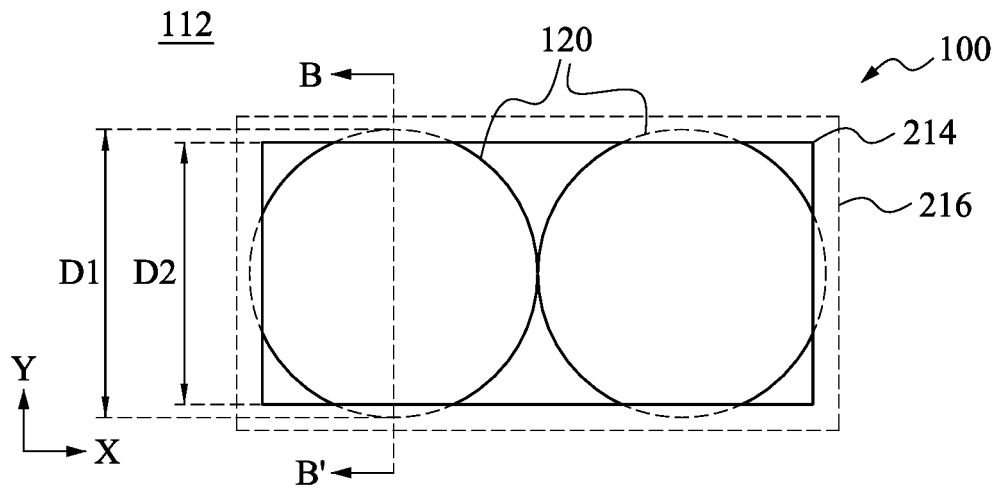
Figure 2C:
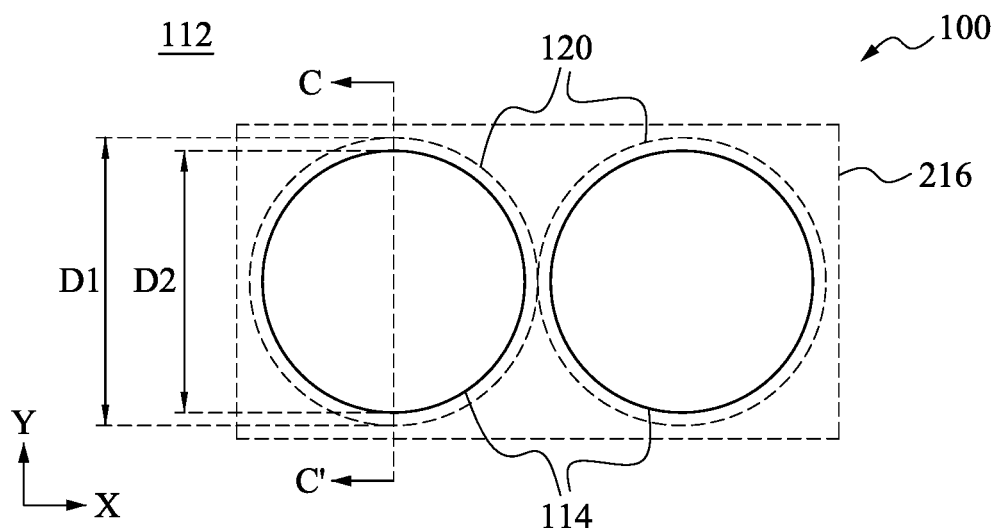

FIGS. 2A-2C are diagrams of top views of substrate support apparatus 100, in accordance with some embodiments. Each of FIGS. 2A-2C depicts a portion of top surface 112, at least one spherical support 120, diameter D1, and width D2 discussed above with respect to substrate support apparatus 100 and FIG. 1A. Each of FIGS. 2A-2C also depicts a direction X, and a direction Y, perpendicular to direction X.

FIG. 2A, in addition to top surface 112, spherical support 120, diameter D1, width D2, and directions X and Y, depicts opening 114 and chamber 116 discussed above with respect to substrate support apparatus 100 and FIG. 1A. Diameter D1 and width D2 correspond to the cross-sectional plane depicted in FIG. 1A, indicated by line A-A' in FIG. 2A.

In the embodiment depicted in FIG. 2A, substrate support apparatus 100 is configured to have chamber 116 correspond to a single opening 114 and a single spherical support 120. Accordingly, chamber 116 has substantially equal dimensions in the X and Y directions.

FIG. 2B, in addition to top surface 112, spherical support 120, diameter D1, width D2, and directions X and Y, depicts an opening 214 and a chamber 216. Diameter D1 and width D2 correspond to the cross-sectional plane depicted in FIG. 1A, indicated by line B-B' in FIG. 2B.

In the embodiment depicted in FIG. 2B, substrate support apparatus 100 is configured to have chamber 216 correspond to a single opening 214 and two spherical supports 120. Accordingly, each of chamber 216 and opening 214 is longer in the X direction than in the Y direction.

In some embodiments, substrate support apparatus 100 is configured to have chamber 216 correspond to a single opening 214 and more than two spherical supports 120.

FIG. 2C, in addition to top surface 112, spherical support 120, diameter D1, width D2, and directions X and Y, depicts two openings 114 discussed above with respect to substrate support apparatus 100 and FIG. 1A, and chamber 216. Diameter D1 and width D2 correspond to the cross-sectional plane depicted in FIG. 1A, indicated by line C-C' in FIG. 2C.

In the embodiment depicted in FIG. 2C, substrate support apparatus 100 is configured to have chamber 216 correspond to two openings 114 and two spherical supports 120. Accordingly, chamber 216 is longer in the X direction than in the Y direction, and each opening 114 has substantially equal dimensions in the X and Y directions.

In some embodiments, substrate support apparatus 100 is configured to have chamber 216 correspond to more than two openings 114 and more than two spherical supports 120.

Each of the embodiments depicted in FIGS. 2A-2C includes a configuration by which at least one spherical support 120 is positioned and rotatable within a chamber 116 or a chamber 216, and thereby provides the benefits discussed above with respect to substrate support apparatus 100.

Figure 3A:
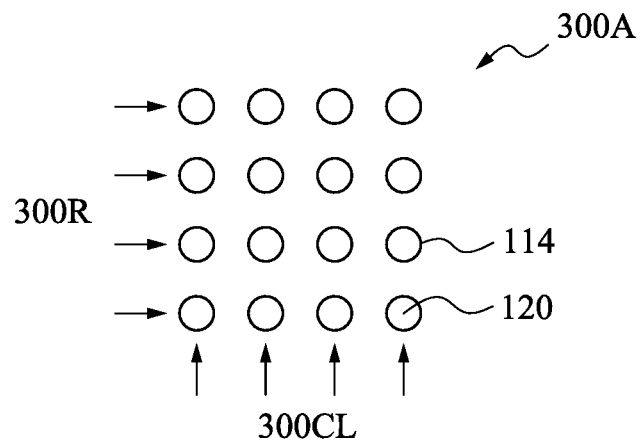
FIGS. 3A-3C are diagrams of spherical support patterns, in accordance with some embodiments.
Figure 3B:
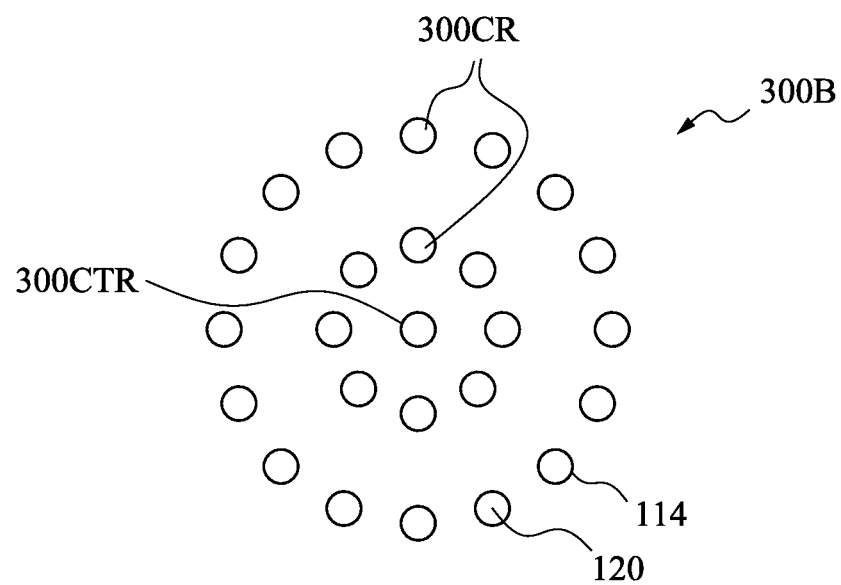
Figure 3C:
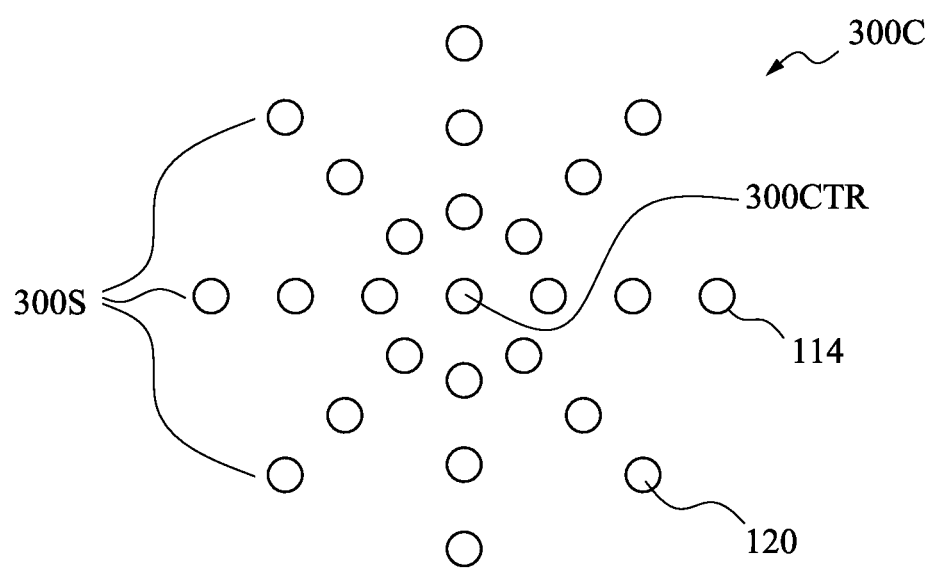

FIGS. 3A-3C are diagrams of spherical support patterns 300A, 300B, and 300C, respectively, in accordance with some embodiments. FIG. 3A depicts a top view of spherical support pattern 300A, FIG. 3B depicts a top view of spherical support pattern 300B, and FIG. 3C depicts a top view of spherical support pattern 300C. Each of spherical support patterns 300A, 300B, and 300C is usable as a spherical support pattern of some or all of spherical supports 120 discussed above with respect to substrate support apparatus 100 and FIG. 1A.

In each of spherical support patterns 300A, 300B, and 300C, locations of spherical supports 120 and openings 114 are separated by one or more distances having one or more values ranging from 1 mm to 5 mm. In some embodiments, locations are separated by one or more distances having one or more values ranging from 2 mm to 3 mm. In some embodiments, locations are separated by one or more distances having one or more values less than 1 mm. In some embodiments, locations are separated by one or more distances having one or more values greater than 5 mm.

Spherical support pattern 300A is a grid array in which spherical supports 120 and openings 114 are arranged in a plurality of rows 300R and a plurality of columns 300CL. Columns of plurality of columns 300CL are perpendicular to rows of plurality of rows 300R. In the embodiment depicted in FIG. 3A, distances between rows of plurality of rows 300R are substantially equal to distances between columns of plurality of columns 300CL. In some embodiments, distances between rows of plurality of rows 300R are different from distances between columns of plurality of columns 300CL.

In the embodiment depicted in FIG. 3A, plurality of rows 300R includes four rows, each containing four locations of spherical supports 120 and openings 114. In various embodiments, plurality of rows 300R includes fewer or greater than four rows. In some embodiments, plurality of rows 300R includes greater than 200 rows.

In various embodiments, one or more rows of plurality of rows 300R includes fewer or greater than four locations. In some embodiments, one or more rows of plurality of rows 300R includes greater than 200 locations.

In the embodiment depicted in FIG. 3A, plurality of columns 300CL includes four columns, each containing four locations of spherical supports 120 and openings 114. In various embodiments, plurality of columns 300CL includes fewer or greater than four columns. In some embodiments, plurality of columns 300CL includes greater than 200 columns.

In various embodiments, one or more columns of plurality of columns 300CL includes fewer or greater than four locations. In some embodiments, one or more columns of plurality of columns 300CL includes greater than 200 locations.

Spherical support pattern 300B is an array of concentric rings in which spherical supports 120 and openings 114 are arranged in a plurality of concentric rings 300CR around a center location 300CTR. In some embodiments, distances between adjacent concentric rings of plurality of concentric rings 300CR are substantially equal. In some embodiments, distances between adjacent concentric rings of plurality of concentric rings 300CR vary.

Each concentric ring of plurality of concentric rings 300CR includes a number of locations of spherical supports 120 and openings 114 that increases as a distance from center location 300CTR increases. In the embodiment depicted in FIG. 3B, two concentric rings of plurality of concentric rings 300CR include either eight or 16 locations. In various embodiments, plurality of concentric rings 300CR includes one or greater than two concentric rings. In some embodiments, plurality of concentric rings 300CR includes greater than 100 concentric rings.

In various embodiments, concentric rings of plurality of concentric rings 300CR include numbers of locations ranging from three to 1,000. In some embodiments, one or more concentric rings of plurality of concentric rings 300CR include greater than 1,000 locations.

Spherical support pattern 300C is an array of radial spokes in which spherical supports 120 and openings 114 are arranged in a plurality of spokes 300S around center location 300CTR. In the embodiment depicted in FIG. 3C, spokes of plurality of spokes 300S are symmetrically arranged around center location 300CTR. In some embodiments, spherical support pattern 300C includes an arrangement in which one or more spokes of plurality of spokes 300S are asymmetrically arranged around center location 300CTR.

In the embodiment depicted in FIG. 3C, plurality of spokes 300S includes eight spokes, each containing three locations of spherical supports 120 and openings 114. In various embodiments, plurality of spokes 300S includes fewer or greater than eight spokes.

In various embodiments, one or more spokes of plurality of spokes 300S includes fewer or greater than three locations. In some embodiments, one or more spokes of plurality of spokes 300S includes greater than 100 locations.

Each of the embodiments depicted in FIGS. 3A-3C includes a configuration by which spherical supports 120 are positioned and rotatable within chambers 116 or 216, and thereby provides the benefits discussed above with respect to substrate support apparatus 100.

Figure 4A:
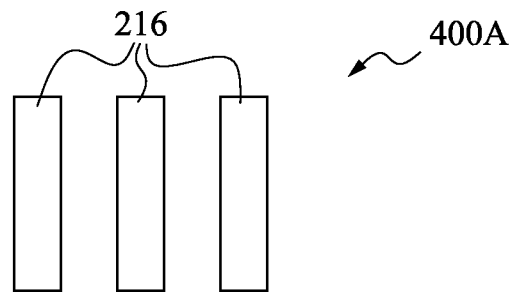
FIGS. 4A-4C are diagrams of chamber patterns, in accordance with some embodiments.
Figure 4B:
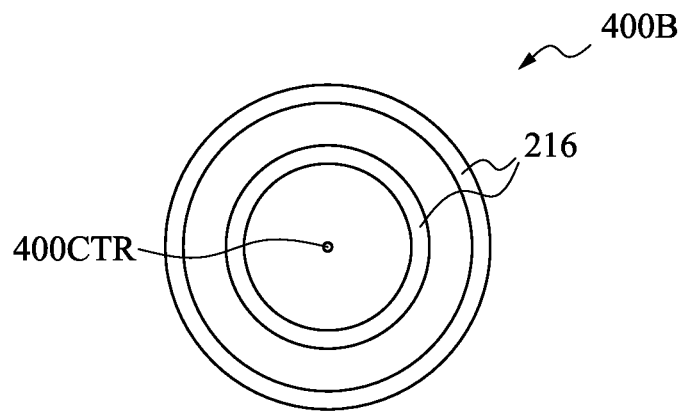
Figure 4C:
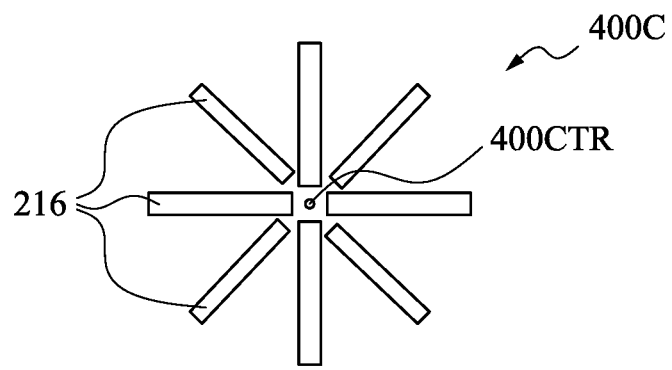

FIGS. 4A-4C are diagrams of chamber patterns 400A, 400B, and 400C, respectively, in accordance with some embodiments. FIG. 4A depicts a top view of chamber pattern 400A, FIG. 4B depicts a top view of chamber pattern 400B, and FIG. 4C depicts a top view of chamber pattern 400C. Each of chamber patterns 400A, 400B, and 400C is usable as a chamber pattern of some or all of chambers 216 discussed above with respect to substrate support apparatus 100 and FIGS. 2B and 2C.

In each of chamber patterns 400A, 400B, and 400C, locations of chambers 116 are separated by one or more distances having one or more values ranging from 1 mm to 5 mm. In some embodiments, locations are separated by one or more distances having one or more values ranging from 2 mm to 3 mm. In some embodiments, locations are separated by one or more distances having one or more values less than 1 mm. In some embodiments, locations are separated by one or more distances having one or more values greater than 5 mm.

Each of chamber patterns 400A, 400B, and 400C is usable as an arrangement corresponding to one or more substrate supports 120 and one or more openings 114. In some embodiments, one or more of chamber patterns 400A, 400B, or 400C is usable as an arrangement corresponding to one or more substrate supports 120 and one or more openings 114 arranged according to one or more of substrate support patterns 300A, 300B, or 300C discussed above with respect to FIGS. 3A-3C.

Chamber pattern 400A is a side-by-side arrangement of a plurality of chambers 216. In the embodiment depicted in FIG. 4A, each chamber 216 has a length oriented vertically and a width oriented horizontally. In some embodiments, one or more chambers 216 has as a width oriented vertically and a length oriented horizontally.

In the embodiment depicted in FIG. 4A, distances between adjacent chambers 216 are substantially equal. In some embodiments, distances between adjacent chambers 216 vary.

In the embodiment depicted in FIG. 4A, chambers 216 have shapes and sizes that are substantially the same. In some embodiments, one more chambers 216 has one or both of a shape or size that varies with respect to one or more other chambers 216.

Chamber pattern 400B is a concentric ring arrangement of a plurality of chambers 216 around a center location 400CTR. In some embodiments, distances between adjacent chambers 216 are substantially equal. In some embodiments, distances between adjacent chambers 216 vary.

In the embodiment depicted in FIG. 4B, chamber pattern 400B includes two chambers 216 arranged in concentric rings. In various embodiments, chamber pattern 400B includes one or greater than two chambers 216 arranged in concentric rings. In some embodiments, chamber pattern 400B includes greater than 100 chambers 216 arranged in concentric rings.

Chamber pattern 400C is a spoke arrangement of a plurality of chambers 216 around center location 400CTR. In the embodiment depicted in FIG. 4C, chambers 216 are symmetrically arranged around center location 400CTR. In some embodiments, chamber pattern 400C includes an arrangement in which one or more chambers 216 are asymmetrically arranged around center location 400CTR.

In the embodiment depicted in FIG. 4C, chambers 216 have shapes and sizes that are substantially the same. In some embodiments, one more chambers 216 has one or both of a shape or size that varies with respect to one or more other chambers 216.

In the embodiment depicted in FIG. 4C, chamber pattern 400C includes eight chambers 216 arranged in concentric rings. In various embodiments, chamber pattern 400C includes fewer or greater than eight chambers 216 arranged as spokes. In some embodiments, chamber pattern 400C includes greater than 100 chambers 216 arranged as spokes.

Each of the embodiments depicted in FIGS. 4A-4C includes a configuration by which spherical supports 120 are positioned and rotatable within chambers 216, and thereby provides the benefits discussed above with respect to substrate support apparatus 100.

Figure 5:
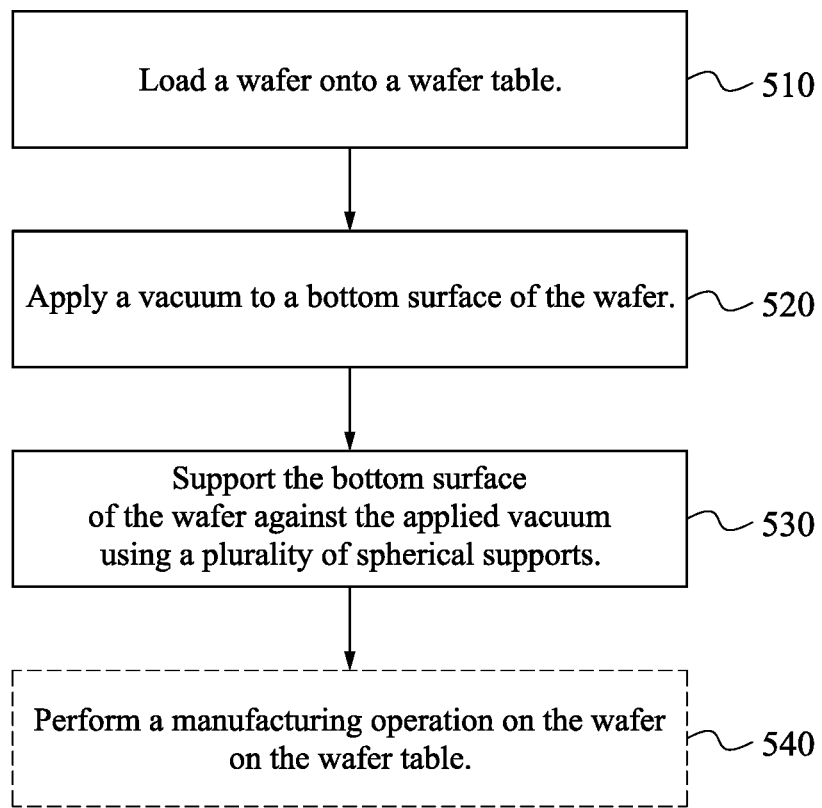
FIG. 5 is a flowchart of a method of supporting a substrate, in accordance with some embodiments.

FIG. 5 is a flowchart of a method 500 of supporting a substrate, in accordance with one or more embodiments. Method 500 is also referred to as a method of supporting a wafer. Method 500 is capable of being performed with a substrate support apparatus, e.g., substrate support apparatus 100 discussed above with respect to FIGS. 1A-4C.

The sequence in which the operations of method 500 are depicted in FIG. 5 is for illustration only; the operations of method 500 are capable of being executed in sequences that differ from that depicted in FIG. 5. In some embodiments, operations in addition to those depicted in FIG. 5 are performed before, during, between, and/or after the operations depicted in FIG. 5.

At operation 510, a wafer is loaded onto a wafer table. In some embodiments, loading a wafer onto a wafer table includes loading a wafer onto substrate support apparatus 100 discussed above with respect to FIGS. 1A-2C.

In some embodiments, loading a wafer onto a wafer table includes loading substrate 150, discussed above with respect to FIGS. 1A and 1B, onto a wafer table.

At operation 520, a vacuum is applied to a bottom surface of the wafer. In some embodiments, applying the vacuum to the bottom surface of the wafer includes applying the vacuum using a chuck. In some embodiments, applying the vacuum to the bottom surface of the wafer includes applying the vacuum using chuck 140 discussed above with respect to FIGS. 1A and 1B.

In some embodiments, applying the vacuum to the bottom surface of the wafer includes applying the vacuum to bottom surface 152 of substrate 150 discussed above with respect to FIGS. 1A and 1B.

In some embodiments, applying the vacuum to the bottom surface of the wafer includes communicating the vacuum to the bottom surface of the wafer using substrate support apparatus 100 discussed above with respect to FIGS. 1A-2C.

At operation 530, the bottom surface of the wafer is supported against the applied vacuum using a plurality of spherical supports. In some embodiments, supporting the bottom surface of the wafer against the applied vacuum includes using spherical supports 120 discussed above with respect to substrate support apparatus 100 and FIGS. 1A-4C. In some embodiments, supporting the bottom surface of the wafer against the applied vacuum includes supporting bottom surface 152 of substrate 150 discussed above with respect to FIGS. 1A and 1B.

In some embodiments, supporting the bottom surface of the wafer against the applied vacuum includes rotating a spherical support of the plurality of spherical supports within a housing. The housing is configured to position the plurality of spherical supports having topmost surfaces arranged in a plane. In some embodiments, supporting the bottom surface of the wafer against the applied vacuum includes rotating spherical support 120 within housing 110 discussed above with respect to substrate support apparatus 100 and FIGS. 1A-4C.

In some embodiments, supporting the bottom surface of the wafer against the applied vacuum includes aligning the bottom surface of the wafer along a plane defined by topmost surfaces of the plurality of spherical supports. In some embodiments, supporting the bottom surface of the wafer against the applied vacuum includes aligning the bottom surface of the wafer along plane P defined by topmost surfaces 122 of spherical supports 120 discussed above with respect to substrate support apparatus 100 and FIGS. 1A-4C. In some embodiments, supporting the bottom surface of the wafer against the applied vacuum includes aligning bottom surface 152 of substrate 150 discussed above with respect to FIGS. 1A and 1B.

In some embodiments, at operation 540, a manufacturing operation is performed on the wafer on the wafer table. In some embodiments, performing the manufacturing operation includes performing the manufacturing operation on substrate 150 discussed above with respect to FIGS. 1A and 1B. In some embodiments, performing the manufacturing operation includes controlling a position of the wafer using chuck 140 discussed above with respect to substrate support apparatus 100 and FIGS. 1A-4C.

In some embodiments, performing the manufacturing operation includes performing the manufacturing operation on the wafer on substrate support apparatus 100 discussed above with respect FIGS. 1A-4C.

In some embodiments, performing the manufacturing operation includes performing the manufacturing operation including an alignment to a feature formed on the wafer prior to the loading the wafer onto the wafer table. In some embodiments, performing the manufacturing operation includes performing one or more photolithography operations. In some embodiments, performing the manufacturing operation includes performing one or more overlay operations. In some embodiments, performing the manufacturing operation includes performing one or more optical inspection operations The operations of method 500 are usable to support a wafer on a wafer table using a plurality of spherical supports. By using the plurality of spherical supports, the wafer responds to the applied vacuum by flattening with little resistance from the plurality of spherical supports. Compared to approaches that do not support a wafer using a plurality of spherical supports, the lowered resistance to substrate flattening provided by method 500 allows wafers to have improved planarity during IC manufacturing operations. This improved planarity translates to reduced height variations throughout a wafer such that height-sensitive operations, including feature overlays, are improved compared to approaches that do not include a plurality of spherical supports in a wafer table.

In some embodiments, a substrate support apparatus includes a housing having a top surface, the top surface including a plurality of openings, and a plurality of spherical supports. The housing is configured to position the plurality of spherical supports within the plurality of openings so that topmost surfaces of the plurality of spherical supports are arranged in a plane above the top surface, and a spherical support of the plurality of spherical supports is rotatable within the housing.

In some embodiments, a wafer table includes a plurality of spherical supports and a plurality of chambers. Each chamber of the plurality of chambers is configured to house a spherical support of the plurality of spherical supports, the wafer table is configured to position the plurality of spherical supports having topmost surfaces arranged in a plane, and each spherical support of the plurality of spherical supports is rotatable within a corresponding chamber of the plurality of chambers.

In some embodiments, a method of supporting a wafer includes loading a wafer onto a wafer table, applying a vacuum to a bottom surface of the wafer, and supporting the bottom surface of the wafer against the applied vacuum using a plurality of spherical supports.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A substrate support apparatus comprising:
a housing having an upper surface, wherein an entirety of the upper surface is substantially planar, and a plurality of openings extending into the housing;
a plurality of spherical supports,
wherein the housing comprises a plurality of chambers, and each opening of the plurality of openings corresponds to a chamber of the plurality of chambers,
wherein the housing is configured to position the plurality of spherical supports within the plurality of openings so that bottommost surfaces of the plurality of spherical supports contact bottom surfaces of the plurality of chambers, and topmost surfaces of the plurality of spherical supports are arranged in a plane above the upper surface, with a subset of the plurality of spherical supports distributed across a central region of the housing,
wherein at least one of the subset of the plurality of spherical supports is freely rotatable within the housing,
wherein only the plurality of spherical supports is configured to directly contact a substrate and the housing is configured to position the plurality of spherical supports within the plurality of chambers such that each spherical support of the plurality of spherical supports projects by a same fixed distance above the upper surface when in contact with the substrate, and
wherein each spherical support of the plurality of spherical supports has a diameter, and each opening of the plurality of openings has an upper diameter, the upper diameter being smaller than the diameter of each spherical support within a corresponding opening; and
a vacuum aperture for inducing a reduced pressure condition at a periphery of the upper surface,
wherein each of the spherical supports of the plurality of spherical supports positioned within a single chamber is rotatable within the single chamber, and
wherein at least one chamber of the plurality of chambers is configured to contain more than one spherical support of the plurality of spherical supports.

2. The substrate support apparatus of claim 1, wherein each opening of the plurality of openings has a lower width, the lower width being greater than the diameter of each spherical support positioned within the opening.

3. The substrate support apparatus of claim 1, wherein each spherical support of the plurality of spherical supports has a diameter ranging from 0.25 millimeters (mm) to 0.50 mm.

4. The substrate support apparatus of claim 1, wherein each spherical support of the plurality of spherical supports comprises SiC.

5. The substrate support apparatus of claim 1, wherein the openings of the plurality of openings are separated by one or more distances ranging from 2.0 millimeters (mm) to 5.0 mm.

6. The substrate support apparatus of claim 1, wherein the plurality of openings comprises at least 4,000 openings.

7. The substrate support apparatus of claim 1, wherein the housing comprises:
a bottom section configured to arrange the topmost surfaces of the plurality of spherical supports in the plane above the upper surface; and
a top section configured to retain the spherical support of the plurality of spherical supports within the housing while allowing the spherical support of the plurality of spherical supports to rotate.

8. A wafer table comprising:
a substantially planar wafer table surface;
a plurality of spherical supports, wherein each of the spherical supports has a diameter;
a plurality of chambers below the wafer table surface, each chamber of the plurality of chambers configured to house a spherical support of the plurality of spherical supports,
  wherein each chamber of the plurality of chambers has a bottom surface that is separated by a fixed first distance from the wafer table surface, the first distance being less than the diameter, the plurality of spherical supports having topmost surfaces arranged in a plane above the wafer table surface with a subset of the plurality of spherical supports distributed across a central region of the wafer table surface, and
  wherein each spherical support of the plurality of spherical supports is rotatable within a corresponding chamber of the plurality of chambers;
a plate over the plurality of chambers, wherein the plate includes a plurality of openings vertically aligned with the plurality of chambers, wherein each opening of the plurality of openings has an opening diameter that is less than a diameter of each spherical support positioned below the opening; and
a vacuum aperture adjacent to the wafer table surface for inducing a reduced pressure condition at the wafer table surface,
wherein each of the spherical supports of the plurality of spherical supports positioned within a single chamber is rotatable within the single chamber, and
wherein at least one chamber of the plurality of chambers is configured to contain more than one spherical support of the plurality of spherical supports.

9. The wafer table of claim 8, wherein the wafer table is configured to be positioned within a recess of a chuck.

10. The wafer table of claim 8, wherein the plurality of spherical supports is arranged in an array of rows and columns.

11. The wafer table of claim 8, wherein the plurality of spherical supports is arranged in an array of concentric rings.

12. The wafer table of claim 8, wherein the wafer table surface comprises a plurality of openings corresponding to the plurality of spherical supports.

13. A substrate support system comprising:
a substrate support apparatus comprising:
  a plurality of spherical supports, wherein each of the spherical supports has a diameter $D_s$;
  a bottom housing section comprising a plurality of chambers wherein each of the chambers has a diameter $W_c$ that satisfies an expression $W_c > D_s$ and has a depth $D_c$ that satisfies an expression $D_c < D_s$; and
  a top housing section in direct contact with the bottom housing section and having a substantially planar top surface and comprising a plurality of openings wherein each of the openings has a width $W_o$ that satisfies an expression $W_o < D_s$ and is aligned with one of the plurality of chambers, wherein
    the depth $D_c$ of each chamber is defined as a distance between a bottom surface of the chamber and the top surface of the top housing section,
    the plurality of chambers and plurality of openings are configured to contain the plurality of spherical supports, thereby positioning topmost surfaces of the plurality of spherical supports in a plane above the top surface of the top housing section,
    each chamber has an upper opening having an opening diameter that is less than a diameter of one of the plurality of spherical supports positioned partially below the upper opening; and
    each spherical support of the plurality of spherical supports is rotatable within a chamber of the plurality of chambers; and
a chuck configured to support the substrate support apparatus and communicate a vacuum to the substrate support apparatus,
wherein each of the spherical supports of the plurality of spherical supports positioned within a single chamber is rotatable within the single chamber, and
wherein at least one chamber of the plurality of chambers is configured to contain more than one spherical support of the plurality of spherical supports.

14. The substrate support system of claim 13, wherein the substrate support apparatus is configured to communicate the vacuum from the chuck to a bottom surface of a substrate being supported solely on the topmost surfaces of the plurality of spherical supports.

15. The substrate support system of claim 13, wherein the substrate support apparatus comprises a plurality of supports configured to position the bottom housing section above the chuck.

16. The substrate support system of claim 13, wherein the chuck comprises a plurality of apertures configured to apply the vacuum to the bottom housing section.

17. The substrate support system of claim 13, wherein the chuck is a component of an integrated circuit manufacturing system configured to perform one or more of a photolithography operation, an overlay operation, or an optical inspection operation.

18. The substrate support system of claim 13, wherein each spherical support of the plurality of spherical supports has a diameter ranging from 0.25 millimeters (mm) to 0.50 mm.

19. The substrate support system of claim 13, wherein each spherical support of the plurality of spherical supports comprises SiC.

20. The substrate support system of claim 13, wherein the openings of the plurality of openings are separated by one or more distances ranging from 2.0 millimeters (mm) to 5.0 mm.

* * * * *